United States Patent [19]

Johnson

[11] 4,089,713

[45] May 16, 1978

[54] DIFFUSION OF DONORS INTO (Hg Cd) Te THROUGH USE OF Ga-Al ALLOY

[75] Inventor: Eric Shanks Johnson, Minnetonka, Minn.

[73] Assignee: Honeywell Inc., Minneapolis, Minn.

[21] Appl. No.: 757,268

[22] Filed: Jan. 6, 1977

[51] Int. Cl.² .......................................... H01L 21/208
[52] U.S. Cl. .................................. 148/178; 148/186; 148/187; 148/188
[58] Field of Search ..................... 75/134 H, 135, 139; 148/1.5, 33, 186, 187, 188, 189, 178; 252/62.3 ZT; 357/11

[56] References Cited

U.S. PATENT DOCUMENTS

| 3,692,594 | 9/1972 | Cannuli | 148/171 |
| 3,745,073 | 7/1973 | Kun et al. | 148/188 X |
| 3,949,223 | 4/1976 | Schmit et al. | 357/30 |
| 4,003,759 | 1/1977 | Koehler | 148/1.5 |

*Primary Examiner*—G. Ozaki
*Attorney, Agent, or Firm*—John S. Munday

[57] ABSTRACT

A method of adjusting donor concentration in a body of mercury cadmium telluride comprising the steps of contacting the mercury cadmium telluride with a quantity of donor material selected from the group consisting of gallium and gallium alloys containing up to 3% of aluminum, tin or cadmium and heating the body at a temperature of at least 200° C for a sufficient time to diffuse the donor material within the body. The donor material is placed in contact with the body of mercury cadmium telluride by immersing the body in a molten quantity of the donor material to wet the surface thereof. Further included is the step of removing any undistributed donor material after heating. Also disclosed is a method of adjusting the donor concentration in the first region of mercury cadmium telluride with respect to a second adjacent region by practicing the process of this invention on the first region only. Since donor materials tend to increase the N-type concentration, a PN junction can be formed from P-type material and an N N+ junction may be formed from N-type material.

15 Claims, No Drawings

DIFFUSION OF DONORS INTO (Hg Cd) Te THROUGH USE OF Ga-Al ALLOY

ORIGIN OF THE INVENTION

This invention was made in the course of a contact with the Department of the Air Force.

BACKGROUND OF THE INVENTION

The present invention is concerned with mercury cadmium telluride semiconductor devices. In particular, the present invention is directed to a method of introducing impurities into mercury cadmium telluride. For the purposes of this specification, the common chemical equations for mercury cadmium telluride (Hg,Cd)Te or $Hg_{1-x}Cd_xTe$, will be used.

Mercury cadmium telluride is an intrinsic photodetector material which consists of a mixture of cadmium telluride, a wide gap semiconductor ($E_g = 1.6eV$), with mercury telluride, which is a semimetal having a negative energy gap of about $-0.3eV$. The energy gap of the alloy varies approximately linearly with $x$, the mole fraction of cadmium telluride in the alloy. By properly selecting $x$, it is possible to obtain (Hg,Cd)Te detector material having a peak response over a wide range of infrared wavelengths. High performance (Hg,Cd)Te detectors have been achieved for wavelengths of from about one to about 30 microns.

Mercury cadmium telluride photodiodes have found increasing use in recent years. With this increasing use, more sophisticated photodiodes such as (Hg,Cd)Te reach-through avalanche photodiodes have become desirable. As a result, improved methods of forming PN junctions in (Hg,Cd)Te have become highly desirable. Also, other uses of either P-type or N-type material doped to various degrees have found uses not previously considered.

In another area of technical development, (Hg,Cd)Te is of particular importance as a detector material for the important 8 to 14 micron atmospheric transmission "window". Extrinsic photoconductor detectors, notably mercury doped germanium, have been available with high performances in the 8 to 14 micron wavelength interval. These extrinsic photoconductors, however, require very low operating temperatures of below 30° K. (Hg,Cd)Te intrinsic photodetectors, having a spectral cutoff of 14 microns, on the other hand, are capable of high performance at 77° K.

The possible application of (Hg,Cd)Te as an intrinsic photodetector material for infrared wavelengths was first suggested by W. G. Lawson, et al, *J. Phys. Chem. Solids*, 9, 325 (1959). Since that time extensive investigation of (Hg,Cd)Te detectors has been achieved for wavelengths from about one to 30 microns.

Despite the potential advantages of (Hg,Cd)Te as an infrared detector material, (Hg,Cd)Te photodetectors have recently found wide use in infrared detector systems. A difficulty with (Hg,Cd)Te has been in preparing high quality, uniform material in a consistent manner. The preparation of (Hg,Cd)Te crystals having the desired conductivity type, has been found to be particularly difficult.

Several properties of the (Hg,Cd)Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Crystal growth methods, which involve slow cooling along the length of an ingot, produce an inhomogeneous body of (Hg,Cd)Te. Second, the high vapor pressure of Hg over the melt requires special care to maintain melt stoichiometry. Third, the segregation of excess Te can give rise to a pronounced constitutional super cooling.

A number of bulk growth techniques have been investigated. Zone melting methods for preparing (Hg,Cd)Te have been developed by B. E. Bartlett, et al, *J. Mater. Sci.*, 4, 266 (1969); E. Z. Dzuiba, *J. of Electrochem. Soc.*, 116, 104 (1969); and R. Ueda, et al, *J. Crystal Growth*, 13/14, 668 (1972). Still other bulk growth techniques for (Hg,Cd)Te have been described by J. Blair, et al, *Conference on Metallurgy of Elemental and Compound Semiconductors*, 12, 393 (1961) and J. C. Woolley, et al, *J. Phys. Chem. Solids*, 13, 151 (1960).

All of the bulk growth techniques require additional post-growth processing steps to produce photodetectors. The crystal must be sliced and the surface prepared by polishing and etching. The (Hg,Cd)Te slice is then epoxied to a substrate such as germanium. This is a particular disadvantage in the fabrication of detector arrays, since it is inconvenient, expensive and generally unsatisfactory to fabricate arrays by assembling discrete detector elements. The epoxy layer, in addition to complicating detector and detector array fabrication, results in a thermal barrier between the (Hg,Cd)Te and the substrate. This thermal barrier can adversely affect performance when significant heating occurs during use.

Epitaxial growth techniques defined below offer the possibility of eliminating the epoxy layer and avoiding many of the post-growth processing steps required for bulk growth techniques. An epitaxial layer is a smooth continuous film grown on a substrate, such that the film crystal structure corresponds to and is determined by that of the substrate. The desired epitaxial layer is single crystal with uniform thickness and electrical properties. The substrate has a different composition or electrical properties from that of the epitaxial layer.

Vapor phase epitaxial growth techniques have been investigated in an attempt to grow (Hg,Cd)Te layers. One vapor phase epitaxial growth technique which has been investigated is the vapor transport of the three constituent elements to a substrate with compound and alloy formation at that point. The vapor transport generally involves additional materials as transport agents, such as halogens. The vapor transport techniques have been described by R. Ruehrwein (U.S. Pat. No. 3,496,024), G. Manley, et al. U.S. Pat. No. (3,619,282), D. Carpenter, et al. (U.S. Pat. No. 3,619,283) and R. Lee, et al. (U.S. Pat. No. 3,642,529).

Another vapor phase epitaxial growth process has been studied by R. J. Hager, et al. (U.S. Pat. No. 3,725,135) and by G. Coehn-Solal, et al, *Compt. Rend.*, 261, 931 (1965). This approach involves an evaporation--diffusion mechanism without the use of any additional materials as transport agents. In this method, a single crystal wafer of CdTe is used as the substrate, and either HgTe or (Hg,Cd)Te is used as the source. At a high enough temperature the material evaporates from the source and migrates in the vapor phase to the CdTe substrate, on which it deposits epitaxially.

In spite of their apparent advantage, epitaxial films of (Hg,Cd)Te formed by vapor phase techniques have been less satisfactory than (Hg,Cd)Te crystals formed by bulk growth because of a compositional gradient along the crystal growth direction which has made them less desirable for detector applications.

Other epitaxial growth techniques have also been attempted. R. Ludeke, et al, *J. Appl. Phys.*, 37, 3499 (1966) grew epitaxial films of (Hg,Cd)Te on single crystal barium fluoride substrates by flash evaporation in vacuum. The samples were grown for studies of optical properties. The technique is probably not practical for the preparation of detector material. H. Krause, et al, *J. Electrochem. Soc.*, 114, 616 (1967), deposited films of (Hg,Cd)Te on single crystal substrates of sodium chloride, germanium and sapphire by means of cathodic sputtering. The resulting films were amorphous as deposited and became crystalline only upon subsequent annealing. The formation of (Hg,Cd)Te by mercury ion bombardment of CdTe has been attempted by N. Foss, *J. Appl. Phys.*, 39, 6029 (1968). This approach was not successful in forming an epitaxial layer.

Another epitaxial growth technique, liquid phase epitaxy, has been used with success in growing other semiconductor materials and in growing garnets for bubble memory applications. In particular, liquid phase epitaxy has been used successfully in the preparation of gallium arsenide, gallium phosphide and lead tin telluride. These materials generally differ from (Hg,Cd)Te, however, in that they (GaAs and GaP) do not have all the severe segregation problem present in (Hg,Cd)Te nor do they have the problem of high vapor pressure of mercury over the melt.

U.S. Pat. No. 3,718,511 by M. Moulin, which describes liquid phase epitaxial growth of lead tin telluride and lead tin selenide, suggests that analogous growth arrangements could be made for the alloys zinc selenide telluride and (Hg,Cd)Te. The patent, however, gives specific examples of liquid phase epitaxy only for lead tin telluride and lead tin selenide. Despite the suggestion by Moulin, prior attempts to grow (Hg,Cd)Te by liquid phase epitaxy have proved unsuccessful. Thermodynamic considerations or experimental difficulties have prevented achievement of detector-grade (Hg,Cd)Te material.

However, high quality detector-grade (Hg,Cd)Te epitaxial layers have been formed by the liquid phase epitaxial growth techniques of U.S. Pat. No. 3,902,924. A liquid solution of mercury, cadmium and tellurium is formed and is contacted with a substrate. The liquid solution in the boundary layer next to the substrate has a liquidus composition which is corresponding to the solidus composition of the desired (Hg,Cd)Te layer at the growth temperature by the appropriate tie line. Supersaturation produces growth of a layer of (Hg,Cd)Te on the substrate.

The electrical properties of mercury cadmium telluride can be altered either by changing the stoichiometry or by foreign impurity doping. It is generally theorized that interstitial mercury and cadmium produce N-type conductivity while mercury and cadmium vacancies as well as tellurium interstitials produce P-type conductivity. In Applied Physics Letters 10, 241 (1967) C. Verie and J. Ayas suggested the formation of PN junctions in mercury cadmium telluride by the adjustment of stoichiometry. The formation of PN junctions by diffusion of foreign impurities into mercury cadmium telluride is complicated by two requirements. First, it has been thought that the impurity must be able to be diffused into mercury cadmium telluride at a reasonably low temperature. This is necessary to prevent excessive dissociation of the mercury telluride, which would drastically change stoichiometry. The relatively small dissociation energy of mercury telluride greatly complicates the diffusion and annealing procedures for junction preparation. Second, the impurity atom must not completely replace mercury in the lattice and form yet another compound rather than simply dope the crystal. This problem is also due to the small dissociation energy of mercury telluride. Examples of compounds formed by impurities include $InTe_3$, $TeI_2$ and $TeI_4$. None of these materials affect the donor or acceptor concentration in the manner desired.

In U.S. Pat. No. 3,743,553, PN junctions are formed in an N-type body of mercury cadmium telluride by depositing a layer of gold on a surface of the N-type body and heating the body to diffuse the gold into the body, thereby forming a region of P-type conductivity in the N-type body.

The formation of PN junctions in (Hg,Cd)Te is complicated by the small dissociation energy of mercury telluride in the alloy. So too are the difficulties incurred in adjusting carrier concentrations of adjoining regions of the same type. The formation of PN junctions must not cause excessive dissociation of the mercury telluride, since this will adversely affect the electrical and optical properties of the resulting devices.

Several techniques have been developed for forming N-type layers on a P-type body of (Hg,Cd)Te. Among these techniques are bombardment with protons, electrons or mercury ions. These techniques create an N-type layer by creating a damage induced donor state. These techniques are described in Foyt, et al, "Type Conversion and N-P Junction Formation in (Hg,Cd)Te Produced by Proton Bombardment", Appl. Phys. Let., 18, 321 (1971); McIngailis, et al, "Electron Radiation Damage and Annealing of (Hg,Cd)Te at Low Temperatures," J. Appl. Phys., 44, 2647 (1973); and Fiorito, et al, "Hg-Implanted (Hg,Cd)Te Infrared Low Photovoltaic Detectors in the 8 to 14 Micron Range", Appl. Phys. Let., 23, 448 (1973).

Another technique of forming N-type on P-type (Hg,Cd)Te is described by Marine, et al, "Infrared Photovoltaic Detectors from Ion-Implanted (Hg,Cd)Te", Appl. Phys. Let., 23, 450 (1973). This method involves aluminum ion implantation and subsequent anneal at 300° C for one hour to form an N-type in a P-type (Hg,Cd)Te body.

Formation of P-type layers on N-type (Hg,Cd)Te, is limited to two techniques. One common method of forming P-type regions in N-type (Hg,Cd)Te is by depositing a gold layer on a surface of the N-type body and then heating the body to diffuse the gold, thereby forming a region of P-type conductivity. This method is described in U.S. Pat. No. 3,743,553, by M. W. Scott, et al. While this method is generally satisfactory, it does have some shortcomings. In particular, it is difficult to form very abrupt, well-defined PN junctions because gold diffuses extremely rapidly in (Hg,Cd)Te. Devices such as reach-through avalanche photodiodes and wide bandwidth photodiodes, therefore, are difficult, if not impossible to fabricate using gold diffusion.

Another method has been proposed in a commonly owned copending application, filed Mar. 1, 1976, having Ser. No. 662,293, now U.S. Pat. No. 4,003,759. That application discloses a method of introducing acceptor impurities into a region of an (Hg,Cd)Te body. This method allows fabrication of an abrupt, well-defined PN junctions in (Hg,Cd)Te, and comprises implanting gold ions into the (Hg,Cd)Te body and heat treating the body at a relatively low temperature for a short duration.

SUMMARY OF THE INVENTION

It has now been discovered that the donor concentration in mercury cadmium telluride can be increased according to the method of this invention. Specifically, the method includes the steps of contacting a body of mercury cadmium telluride with a quantity of a donor material selected from the group consisting of gallium and gallium alloys obtaining up to 3% of a metal selected from the group consisting of aluminum, tin or cadmium. The second step involves heating the body preferably at a temperature of at least 150° C, for a sufficient time to diffuse the donor material into the body.

Sufficient gallium is diffused into the mercury cadmium telluride to give a concentration of gallium ranging from about $10^{10}$ atoms per cubic centimeter to $10^{20}$ atoms per cubic centimeter. The alloys of gallium containing either aluminum, tin or cadmium contain up to 5% by weight of these metals, and preferably from ½ to 5% by weight. Most preferred is approximately 3% of the metal and 97% gallium.

The body having the donor material should be heated for a sufficient time to diffuse the donor material into the body. Preferably, 250° to about 400° C is a suitable temperature. It has been found that gallium and its alloys as described herein diffuse at a rate of approximately 200 microns per hour. Thus, depending upon the size of the sample, the time at which the sample is heated will vary.

One of the major problems in employing gallium as a donor material is the difficulty of pure gallium to adequately wet the surface of the mercury cadmium telluride. The addition of the minor amounts of alumimum, tin or cadmium to the gallium substantially and significantly improve the wetability of the molten gallium. Accordingly, in a process of increasing the donor concentration of mercury cadmium telluride by diffusing gallium into the crystal, the step of adding up to 5% of a metal selected from the group consisting of aluminum, tin or cadmium provides surprising and important improvement. Surface qualities of the material after diffusion are also improved by this invention.

A number of experiments were performed to demonstrate the efficiencies of the present invention. An essential part of each experiment was the ability to distinguish the impurity effects from other changes produced by heat treatment or lattice damage. For this reason, in each experiment, material identical to that doped with the impurity was subjected to an identical heat treatment. The reference sample was compared with the doped sample in each experiment and the results herein are based on major variations between the reference and doped samples.

Various samples were prepared by contacting a mercury cadmium telluride body of P-type material with molten donor material following by heating at a temperature of 375° C for a sufficient time to diffuse into the crystal at least a portion of the gallium deposited on the surface of the crystal. Donor concentration was substantially increased in areas where diffusion had taken place. The limiting factor on the depth of penetration of the donor material was the length of time of the heating step. As stated above, the gallium diffuses rather rapidly, at a rate of at least 100 microns per hour into the body of the crystal. Upon completion of the diffusion step, the alloy remaining on the surface was removed.

Presented below in the table are the results of various experiments performed according to the practice of this invention.

In the first column the starting mercury cadmium telluride is indicated to be P-type in character. The second column lists the various impurities, if any, added to the mercury cadmium telluride by immersion in a molten bath of the impurity. The third column indicates the diffusion temperature at which the experiment was run. The final column indicates the carrier type of the mercury cadmium telluride in the region which was subjected to diffusion.

TABLE

| Starting Mercury Cadmium telluride | Impurity | Diffusion Temp. (° C) | Final Mercury Cadmium Telluride |
|---|---|---|---|
| P-type | None | 375 | P-type |
| P-type | Gallium | 375 | N-type |
| P-type | Aluminum | 375 | P-type |
| P-type | Tin | 375 | P-type |
| P-type | Gallium - 3% Aluminum Alloy | 375 | N-type |
| P-type | Gallium - 3% Tin Alloy | 375 | N-type |
| P-type | Gallium - 3% Cadmium Alloy | 375 | N-type |

As can be seen from the table above, the addition of no impurity had no effect on the P-type cadmium telluride while diffusion of gallium into the crystal converted the mercury cadmium telluride to N-type. Similar experiments using only aluminum and tin from evaporated sources failed to convert any of the P-type material to N-type at these diffusion temperatures.

Finally, three alloys containing 3% of aluminum, tin and cadmium respectively were treated. In each case, the P-type material was converted to N-type in the region where the diffusion took place. Those samples which contained an alloy of gallium were more readily wetted during immersion of the body of the crystal into the molten alloy.

Although this invention has been described with reference to a series of preferred embodiments, the workers skilled in the art will recognize that modifications may be made without departing from the spirit and scope of the present invention.

The embodiments of the invention in which an exclusive property or right is claimed are defined as follows:

1. The method of adjusting the donor concentration in a body of mercury cadmium telluride, comprising the steps of:
   contacting a body of mercury cadmium telluride with a quantity of a donor material selected from the group consisting of gallium and gallium alloys containing up to 5% by weight of a metal selected from the group consisting of aluminum, tin and cadmium; and
   heating said body at a temperature of at least 150° C for a sufficient time to diffuse said donor material within said body.

2. The method of claim 1 wherein from $10^{10}$ atoms per cubic centimeter to $10^{20}$ per cubic centimeter of gallium are diffused in said mercury cadmium telluride.

3. The method of claim 1 wherein said gallium alloy contains from ½ to 5% by weight aluminum.

4. The method of claim 1 wherein said gallium alloy contains from ½ to 5% by weight of tin.

5. The method of claim 1 wherein said gallium alloy contains from ½ to 5% by weight cadmium.

6. The method of claim 1 wherein said temperature ranges from 250° to 400° C.

7. A method of increasing the donor concentration in a first region of mercury cadmium telluride with respect to a second adjacent region of mercury cadmium telluride, comprising the steps of:
contact the exterior surface of the first region of said mercury cadmium telluride with a quantity of a donor material selected from the group consisting of gallium and gallium alloys containing up to 5% by weight of a metal selected from the group consisting of aluminum, tin and cadmium; and
heating said first region at a temperature of at least 150° C for a sufficient time to distribute said donor material within said body.

8. The method of claim 7 wherein from $10^{10}$ atoms per cubic centimeter to $10^{20}$ atoms per cubic centimeter of gallium are diffused in said mercury cadmium telluride.

9. The method of claim 7 wherein said gallium alloy contains from ½ to 5% by weight aluminum.

10. The method of claim 7 wherein said gallium alloy contains from ½ to 5% by weight of tin.

11. The method of claim 7 wherein said gallium alloy contains from ½ to 5% by weight cadmium.

12. The method of claim 7 wherein said temperature ranges from 150° to 400° C.

13. The method of claim 7 wherein said second region is P-type and said quantity of donor material is sufficient to render said first region N-type, thereby forming a PN junction.

14. The method of claim 7 wherein said second region is N-type and said quantity of donor material is sufficient to render said first region N+ type.

15. In a method of adjusting the donor concentration of a body of mercury cadmium telluride, including the steps of contacting said body with a quantity of gallium and heating at a temperature of at least 200° C for a sufficient time to diffuse said gallium into said mercury cadmium telluride, the improvement comprising:
alloying from ½ to 5% of a metal selected from the group consisting of aluminum, tin and cadmium with said gallium prior to contacting said gallium with said mercury cadmium telluride.

* * * * *